(12) United States Patent
Fan

(10) Patent No.: US 7,477,061 B2
(45) Date of Patent: Jan. 13, 2009

(54) PROBE CARD

(75) Inventor: Horng-Kuang Fan, Hsinchu Hsiang (TW)

(73) Assignee: MJC Probe Incorporation, Hsinchu Hsiang (TW)

( * ) Notice: Subject to any disclaimer, the term of this patent is extended or adjusted under 35 U.S.C. 154(b) by 192 days.

(21) Appl. No.: 11/647,410

(22) Filed: Dec. 29, 2006

(65) Prior Publication Data

US 2007/0176614 A1 Aug. 2, 2007

(30) Foreign Application Priority Data

Jan. 27, 2006 (TW) .............................. 95103551 A

(51) Int. Cl.
*G01R 31/02* (2006.01)
(52) U.S. Cl. ..................... 324/754; 324/761; 324/762
(58) Field of Classification Search ........................ None
See application file for complete search history.

(56) References Cited

U.S. PATENT DOCUMENTS

| 5,563,521 A * | 10/1996 | Crumly ....................... 324/757 |
| 6,420,886 B1 * | 7/2002 | Ho et al. ..................... 324/754 |
| 6,838,893 B2 * | 1/2005 | Khandros et al. ........... 324/754 |

* cited by examiner

*Primary Examiner*—Vinh P Nguyen
(74) *Attorney, Agent, or Firm*—Browdy and Neimark, P.L.L.C.

(57) ABSTRACT

A probe card mainly includes a circuit board, a probe assembly, an elastic support assembly, a plurality of level maintaining assemblies and a turning secure assembly. The circuit board has pads and spring bores. The probe assembly has a electrical signal transform board and probes on it. The elastic support assembly has a fixed plate, a locking plate and a plurality of springs. The springs are received in the spring bores of the circuit board to urge the electrical signal transform board for absorption of a height difference of the electrical signal transform board when the electrical signal transform board is inclined.

13 Claims, 3 Drawing Sheets

PROBE CARD

BACKGROUND OF THE INVENTION

1. Field of the Invention

The present invention relates to a testing device of integrated circuit and more particularly, to a probe card capable of maintaining horizontal of the probe assembly.

2. Description of the Related Art

Integrated circuits on a wafer have to pass electrical test and those passing the test are picked out for the following package procedure to form chips. The chips are tested again to pick out defective products. In the rear-end process of integrated circuit, there are several testing procedures of the electrical properties of the integrated circuits or chips. In the present electrical test, a probe card is provided which includes several probes contacted with the circuits for testing its electrical properties.

In the electrical test, planes on tips of the probes has to be substantially parallel to planes of pads of the integrated circuit that causes the probes with the same pressure press the pads of the integrated circuit to build a well electrical connection between the probe card and the integrated circuit. It may not build an electrical connection between the probe card and the integrated circuit while the probes with different pressures pressed the pads that makes the probe card can not read the actual electrical properties of the integrated circuit.

The probes are flexible to make parallel between the probes of the probe card and the pads of the integrated circuit, except that the probe card usually is provided with an elastic device to support an electrical signal transform board, on which the probes are provided, for prevention of a difference in height when the electrical signal transform board inclines. Such device was taught in US 2004/0104738, which provides a spring between the electrical signal transform board and a circuit board to prevent the height difference of the electrical signal transform board. It must leave a space between the electrical signal transform board and the circuit board for the spring that increases the size of the probe card and make a loose structure of components. Types of the spring are limited because the spring is between the electrical signal transform board and the circuit board. In addition, a distance between the circuit board and each probes is increased that limits an flexible adjustment of client's products.

SUMICRONSARY OF THE INVENTION

The primary object of the present invention is to provide a probe card, which has a tight structure to enlarge space for other components.

The secondary object of the present invention is to provide a probe card, which has more spring for choice.

The third object of the present invention is to provide a probe card, which decreases a height of thereof to provide a flexible adjustment.

To achieve the objects of the present invention, a probe card includes a circuit board having a plurality of pads and spring bores through the circuit board. A probe assembly has an electrical signal transform board and a plurality of probe. The electrical signal transform board has a first electrical signal side and a second electrical signal side electrically connected to the first electrical signal side. The probes are provided on the first electrical signal side and the pads of the circuit board are electrically connected to the second electrical signal side. An elastic support assembly has a fixed plate, a locking plate and a plurality of springs. The fixed plate is fixed to the first electrical signal side of the electrical signal transform board and the locking plate respectively, and the locking plate has a plurality of bores communicated with the spring bores respectively. The springs are received in the spring bores of the circuit board to urge the electrical signal transform board for absorption of a height difference of the electrical signal transform board when the electrical signal transform board is inclined.

DETAILED DESCRIPTION OF THE INVENTION

Figure 1:
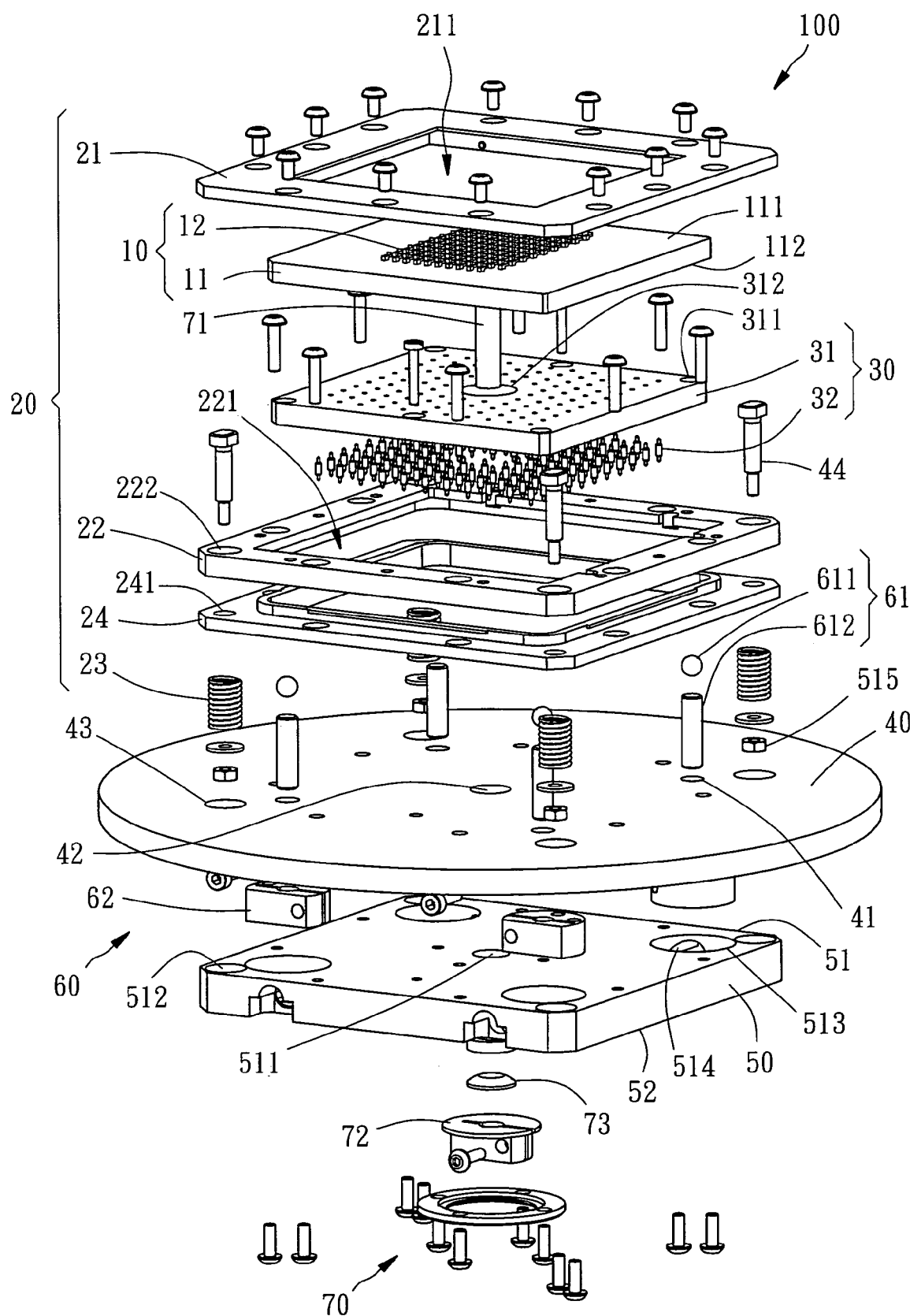
FIG. 1 and FIG. 2 are exploded views of a preferred embodiment of the present invention.
Figure 2:
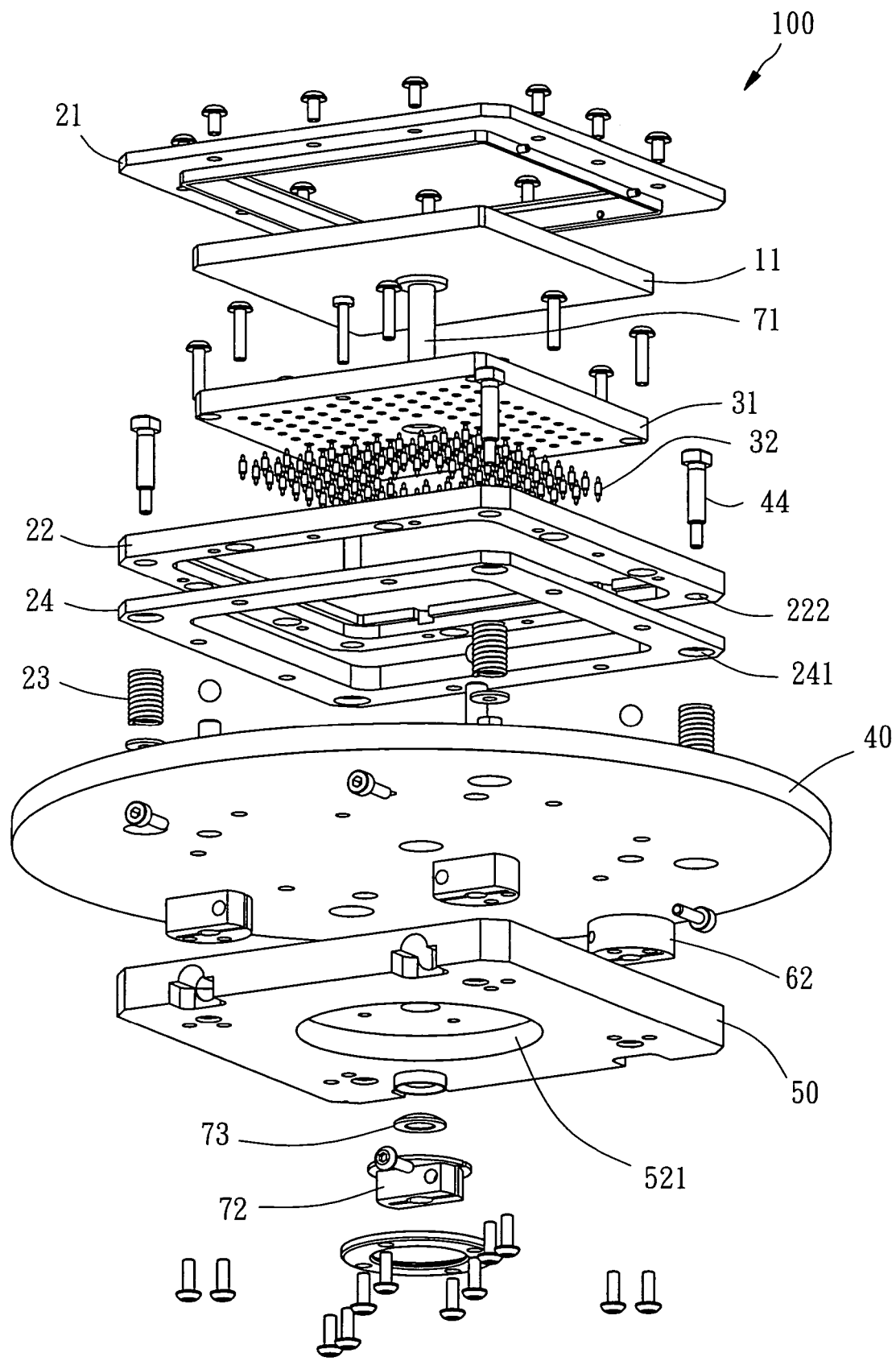
Figure 3:
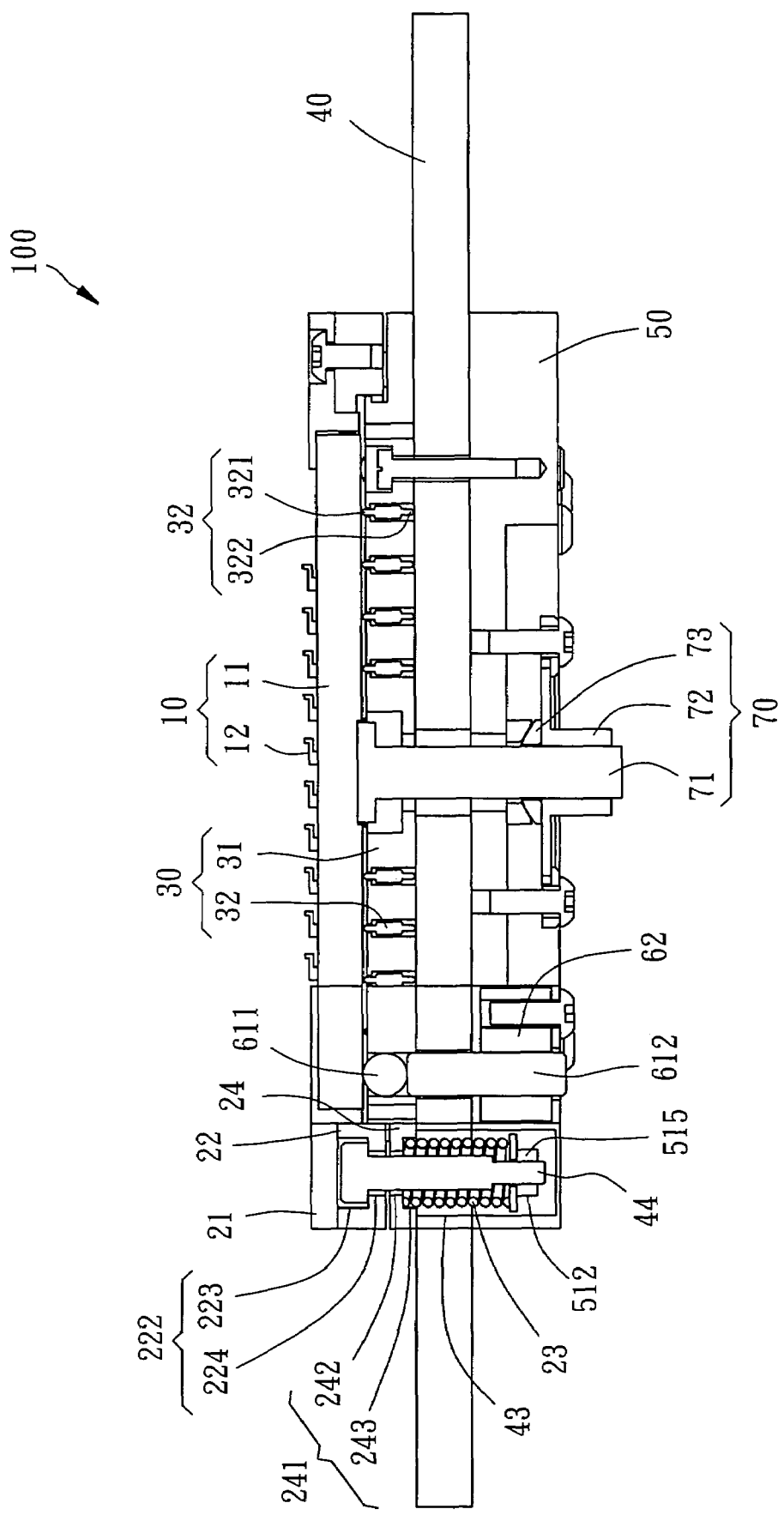
FIG. 3 is a sectional view of the preferred embodiment of the present invention.

As shown in FIGS. 1 to 3, a probe card 100 of the preferred embodiment of the present invention includes a probe assembly 10, an elastic support assemble 20, an elastic connection assembly 30, a circuit board 40, a substrate 50, a plurality of level maintaining assemblies 60 and a turning secure assembly 70.

The probe assembly 10 includes an electrical signal transform board 11 and a plurality of probes 12. The electrical signal transform board 11, which is an insulating rectangular substrate in the present embodiment, having a first electrical signal side 111, a second electrical signal side 112 opposite to the first electrical signal side 111 and a conductor pattern (not shown) therein for electrical connection of first pads (not shown) on the first electrical signal side 111 and second pads (not shown) on the second electrical signal side 112. The probes 12 are flexible metallic member with ends connected to the first pads of the first electrical signal side 111 and the other ends suspended. The suspended ends of the probes may be contacted with a testing object and transfer electrical signal to the second pads of the second electrical signal side 112 through the first pads of the first electrical signal side 111 and the conductor pattern.

The elastic support assemble 20 is connected to the electrical signal transform board 11 with a uniform pressure distribution to absorb a difference in height of the electrical signal transform board 11 while the electrical signal transform board 11 inclines.

The elastic support assemble 20 includes a fixed plate 21, a securing plate 22, a plurality of springs 23 and a locking plate 24. The fixed plate 21, which is a rectangular frame in the present embodiment, has a space 211 at a center thereof. The securing plate 22 has a receiving space 221 at a center and a plurality of bores 222, each of which includes a first bore 223 with a greater diameter and a second bore 224 with a smaller diameter communicated with the first bore 223. The securing plate 22 attaches a side with the first bores 223 on the fixed plate 21 and is secured thereon by bolts so that the fixed plate 21 and the securing plate 22 are kept in a fixed parallel condition. The locking plate 24, which is a rectangular frame in the present embodiment, has bores 241 associated with the bores 222 of the securing plate 22. Each of the bores 241 includes a first bore 243 with a smaller diameter and a second bore 244 with a greater diameter communicated with the first bore 243. The locking plate 24 attaches a side with the first bores 243 on a side with the second bores 224 of the securing plate 22. The springs 23 are compression springs in the present embodiment.

The probe assembly 10 is received in the space 211 of the elastic support assembly 20 and has an edge of the first electrical signal side 111 against the fixed plate 21. The suspended ends of the probes 12 on the first electrical signal side 111 are out of the space 211.

The elastic connection assembly 30 includes a carrier plate 31 and a plurality of elastic pins 32. The carrier plate 31 is an insulating rectangular plate in the present embodiment with four bores 311 at four corners thereof and a bore 312 at a center thereof. The elastic pins 32 are conductive, each of which are received in holes of the carrier plate 31 with opposite ends extruded out of the holes to form first contact terminals 321 at a side of the carrier plate 31 and a second contact terminals 322 at an opposite side of the carrier plate 31.

The elastic connection assembly 30 is received in the space 221 of the elastic support assemble 20 with the first contact terminals 321 of the elastic pins 32 against the second pads of the probe assembly 10 for transference of the electrical signals.

The circuit board 40 has a plurality of pads on a side thereof and spring bores 43. The circuit board 40 attaches a side thereof on locking plate 24 with the spring bores 43 aligned with the second bores 244 respectively and the pads against the second contact terminals 322. Electrical signals are transferred from first pads to the circuit board 40 through the conductor pattern of the electrical signal transform board 11, the second pads, and the first contact terminals 321 and the second contact terminals 322 of the elastic pins 32 in sequence while the probes 12 of the probe assembly 10 electrically contact a testing device (not shown) to test its electrical properties. The circuit board 40 includes a plurality of locking bores 41 and an adjusting bore 42 at a center. The locking bores 41 are communicated with the bores 311 of the elastic connection assembly 30, and the adjusting bore 42 is communicated with the bores 312 respectively.

The substrate 50, which is an insulating rectangular board, includes a first carrier side 51 and a second carrier side 52 opposite to the first carrier side 51. The substrate 50 has a bore 511 at a center through the first and second carrier sides 51, 52 and an adjusting region on the second carrier side 52 around the bore 511. The substrate 50 further has a plurality of recesses, which are defined as adjusting regions 521, on the second carrier side 52 around the bore 511, and a plurality of recesses, which are defined as locking regions 513, on the first carrier side 51, in each of which a locking bore 514 is provided through the second carrier side 52.

The substrate 50 attaches the first carrier side 51 on the circuit board 40 with a plurality of bores 512, in each of which a nut 515 is received respectively, on the first carrier side 51 aligned with the spring bores 43 of the circuit board 40. The springs 23 of the elastic support assembly 20 are received in the spring bores 43 with opposite ends thereof urging the nuts 515 in the bores 512 of the circuit board 40 and interior walls of the bores 241 of the locking plate 24. A bolt 44 is inserted into each spring 23 with a head portion against the corresponding bore 222 of the securing plate 22 and pressed by the fixed plate 21 and a tail end screwed into the nut 515 respectively. The springs 23 are compressed between the securing plate 22, the locking plate 24, the circuit board 40 and the substrate 50 for the fixed plate 21 locking the electrical signal transform board 11 to absorb the height difference of the inclined electrical signal transform board 11. Screws are inserted through the carrier plate 31 of the elastic connection assembly 30 and the circuit board 40 and screwed into the substrate 50 to secure relative positions of the substrate 50, the circuit board 40 and the elastic connection assembly 30. The fixed plate 21 of the elastic support assembly 20 is fixed to the securing plate 22 to secure relative positions of the fixed plate 21 and the securing plate 22.

Each of the level maintaining assemblies 60 includes a support unit 61 and a locking unit 62. The support unit 61 includes a ball 611 and a support device 612. The ball 611, which is a metallic ball, is received in the bore 311 of the elastic connection assembly 30 respectively and touches the second electrical signal side 112 of the probe assembly 10. The support device 612, which is a round column, is inserted into the locking bore 514 of the substrate 50, the locking bore 41 of the circuit board 40 and the bore 311 of the elastic connection assembly 30. Each of the support devices 612 has an end touching the corresponding ball 611 and the other end located in the corresponding locking region 513 of the substrate 50 respectively. The locking unit 62 is received in the corresponding locking region 513 to secure support device 612.

The turning secure assembly 70 includes a support device 71, an adjusting unit 72 and an acting unit 73.

The support unit 71, which is a round column, has an end inserted into the bore on the second carrier side 52 of the substrate 50, through the adjusting bore 42 of the circuit board 40 and the bore 312 of the elastic connection assembly 30, and against the second electrical signal side 112 of the probe assembly 10, and the other end in the adjusting region 521. The adjusting unit 72, which is received in the adjusting region 521, secures the support unit 71. The acting unit 73, which is received between the substrate 50 and the adjusting unit 71, is deformed by an external force to prevent the probe assembly 10 from deformation when the electrical signal transform board 11 is exerted by a pressure that make a deformation of the electrical signal transform board 11.

The operation of the probe card 100 of the present invention is described hereunder:

The electrical signal transform board 11 of the probe assembly 10 is pre-fixed by the fixed plate before the probes 12 of the probe assembly 10 are contacted with a testing device (not shown) that a fine height difference of the electrical signal transform board 11 is absorbed by the springs 23 to maintain a parallel relationship between the electrical signal transform board 11 and the circuit board 40.

The springs 23 are received inside of the probe card 100 of the present invention and no extra interior space is provided for the springs 23 so that the elements of the probe card 100 of the present invention are in a firm connection. As a result, a size of the probe card 100 of the present invention will be reduced. In addition, the springs are received inside of the probe card so that there are various types of springs may be utilized, basically is any one may be received in a bore, and a distance between tips of the probes and the circuit board will not changed by the springs to increase the flexibility of the probe card 100 of the present invention.

What is claimed is:

1. A probe card, comprising:

a circuit board having a plurality of pads and spring bores through the circuit board;

a probe assembly having an electrical signal transform board and a plurality of probe, wherein the electrical signal transform board has a first electrical signal side and a second electrical signal side electrically connected to the first electrical signal side, and the probes are provided on the first electrical signal side and the pads of the circuit board are electrically connected to the second electrical signal side; and an elastic support assembly having a fixed plate, a locking plate and a plurality of springs, wherein the fixed plate is fixed to the first electrical signal side of the electrical signal transform board and the locking plate respectively, and the locking plate has a plurality of bores communicated with the spring bores respectively, and the springs are received in the spring bores of the circuit board to urge the electrical signal transform board for absorption of a height difference of the electrical signal transform board when the electrical signal transform board is inclined.

2. The probe card as claimed in claim 1, further comprising a securing plate fixed to the fixed plate and connected to the first electrical signal side of the electrical signal transform board, wherein the securing plate has a plurality of bores, and the locking plate is between the securing plate and the circuit board with the bores of the locking plate aligned with the bores of the securing plate to receive the springs respectively.

3. The probe card as claimed in claim 1, further comprising a plurality of level maintaining assemblies provided on the circuit board and against the second electrical signal side of the electrical signal transform board to keep the electrical signal transform board in a horizontal position.

4. The probe card as claimed in claim 3, wherein each of the level maintaining assemblies includes a support unit through the circuit board and against the electrical signal transform board and a locking unit fixing the support unit to keep the electrical signal transform board in the horizontal position.

5. The probe card as claimed in claim 4, wherein the support unit includes a ball touching the second electrical signal side of the electrical signal transform board and a support device through the circuit board with an end against the ball and an opposite end fixed by the locking unit.

6. The probe card as claimed in claim 1, wherein the fixed plate of the elastic support assembly has a space at a center thereof, and the securing plate has a receiving space at a center thereof to receive the electrical signal transform board therein with the probes extruded out of the space of the fixed plate.

7. The probe card as claimed in claim 1, further comprising an elastic connection assembly electrically connected to the pads of the circuit board and the second electrical signal side of the electrical signal transform board respectively.

8. The probe card as claimed in claim 7, wherein the elastic connection assembly includes a carrier plate and a plurality of elastic pins received in holes of the carrier plate with opposite ends extruded out of opposite sides of the carrier plate and electrically connected to the second electrical signal side of the electrical signal transform board and the pads of the circuit board respectively.

9. The probe card as claimed in claim 1, further comprising a turning secure assembly against the second electrical signal side of the electrical signal transform board for deformation to keep the electrical signal transform board in a horizontal position when the electrical signal transform board is exerted by an external force.

10. The probe card as claimed in claim 9, wherein the turning secure assembly includes a support unit with an end inserted through the circuit board and against the second electrical signal side of the electrical signal transform board and an adjusting unit securing an opposite end of the support unit.

11. The probe card as claimed in claim 10, wherein the turning secure assembly further includes an acting unit between the circuit board and the adjusting unit for deformation to keep the electrical signal transform board in the horizontal position.

12. The probe card as claimed in claim 1, wherein the springs are compression springs.

13. The probe card as claimed in claim 1, further comprising a substrate fixed on the circuit board, on which a plurality of bores are provided, a plurality of nuts are received in the bores of the substrate respectively, and a plurality of screws inserted into the springs respectively, each of which has a head portion against the bore of the securing plate and a tail end screwed into the nut respectively.

\* \* \* \* \*